United States Patent
Su et al.

(10) Patent No.: US 8,406,266 B2
(45) Date of Patent: Mar. 26, 2013

(54) THREE-TERMINAL VERTICAL CAVITY SURFACE EMITTING LASER (VCSEL) AND A METHOD FOR OPERATING A THREE-TERMINAL VCSEL

(75) Inventors: Chung-Yi Su, Fremont, CA (US); Rashit Nabiev, E. Palo Alto, CA (US); Ramana M. V. Murty, Sunnyvale, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 0 days.

(21) Appl. No.: 13/223,300

(22) Filed: Aug. 31, 2011

(65) Prior Publication Data
US 2013/0051420 A1   Feb. 28, 2013

(51) Int. Cl.
*H01S 5/00* (2006.01)
(52) U.S. Cl. ........... 372/45.013; 372/45.01; 372/50.124; 372/50.11

(58) Field of Classification Search ............. 372/45.013, 372/45.1, 50.124, 50.11
See application file for complete search history.

(56) References Cited

U.S. PATENT DOCUMENTS

| | | | |
|---|---|---|---|
| 5,574,738 A | 11/1996 | Morgan | |
| 5,679,964 A * | 10/1997 | Kobayashi et al. | 257/83 |
| 5,796,714 A * | 8/1998 | Chino et al. | 372/50.124 |
| 6,658,040 B1 | 12/2003 | Hu et al. | |
| 6,697,413 B2 | 2/2004 | Hwang et al. | |
| 6,803,604 B2 | 10/2004 | Takahashi et al. | |
| 7,693,195 B2 * | 4/2010 | Feng et al. | 372/30 |
| 7,916,768 B2 | 3/2011 | Chang et al. | |
| 2012/0128020 A1* | 5/2012 | Gerlach | 372/50.11 |

* cited by examiner

*Primary Examiner* — Kinam Park

(57) ABSTRACT

A three-terminal VCSEL is provided that has a reduced fall time that allows the VCSEL to be operated at higher speeds. Methods of operating the three-terminal VCSEL are also provided. The VCSEL can be operated at higher speeds without decreasing the optical output of the VCSEL when it is in the logical HIGH state.

18 Claims, 5 Drawing Sheets

THREE-TERMINAL VERTICAL CAVITY SURFACE EMITTING LASER (VCSEL) AND A METHOD FOR OPERATING A THREE-TERMINAL VCSEL

TECHNICAL FIELD OF THE INVENTION

The invention relates to vertical cavity surface emitting lasers (VCSELs). More particularly, the invention relates to a three-terminal VCSEL having a reduced fall time to enable the VCSEL to be operated at higher speeds without sacrificing optical output.

BACKGROUND OF THE INVENTION

VCSELs are widely used as light sources for optical interconnect devices, storage area networks, and sensors. The most common configuration of a VCSEL is a two-terminal VCSEL that includes a conducting n-type substrate, an n-type distributed Brag reflector (DBR) disposed on the top surface of the substrate, an intrinsic layer (active region) disposed on top of n-type DBR, a p-type DBR disposed on top of the intrinsic layer, an ohmic n-contact, and an ohmic p-contact. The ohmic n- and p-contacts correspond to respective first and second terminals of the VCSEL. When an electric potential is applied across the terminals, electrons from the n-type layers that are adjacent the intrinsic layer and holes from the p-type layers that are adjacent the intrinsic layer are injected into the active region of the intrinsic layer where they combine to produce photons. This combining of holes and electrons in the active region to produce photons is a phenomenon known as spontaneous emission. As the photons pass out of the active region, they are repeatedly reflected by the DBRs back into the active region, which results in more recombination of electrons and holes in the active region. This is a phenomenon known as stimulated emission. The repeated reflection of photons by the DBRs back into the active region provides the "pumping" action that leads to lasing.

In the two-terminal VCSEL described above, the configuration of the intrinsic layer sandwiched between the n-type and p-type DBRs forms a p-i-n junction, i.e., a diode. The application of the electric potential across the terminals forward biases the junction to cause the electrons and holes to be injected into the active region. The modulation speed of the VCSEL is limited by the interaction between the electrical carriers (electrons and holes) and the photons in the active region.

Three-terminal VCSELs are also known, although they are less common than two-terminal VCSELs. In the two-terminal VCSEL, the p-i-n junction is essentially a base-emitter junction. In the three-terminal VCSEL, a collector is added to give the VCSEL a bipolar junction transistor (BJT) configuration having a base sandwiched between the emitter and the collector. In such configurations, an electric potential is applied across first and second ohmic contacts connected to the base and emitter, respectively, to forward bias the junction, which results in current injection, and ultimately, lasing. An electric modulation signal is also applied across these ohmic contacts to modulate the laser, i.e., to turn it on and off. In some cases, an electric modulation signal is also applied across a third ohmic contact connected to the collector and the first ohmic contact to assist in modulating the active region.

One of the problems associated with the three-terminal VCSEL configuration described above is that the addition of the collector does not increase the speed of the VCSEL. The speed of the VCSEL continues to be limited by the interaction between the carriers and photons in the active region.

Another configuration of a three-terminal VCSEL is disclosed in U.S. Pat. No. 7,693,195. In this configuration, an electrical modulation signal can be applied to the collector terminal and output from the collector terminal. An optical signal is output from the base region. A forward-biasing electrical modulation signal is applied to the base and emitter terminals while a constant reverse-biasing electrical signal is applied to the collector terminal relative to the emitter terminal. Thus, the emitter-collector junction is constantly reverse-biased while the base-emitter junction is switched between a high forward-biased state and a low forward-biased state to switch the laser between a logical HIGH state and a logical LOW state of an input signal, respectively. The input modulation signal applied to the emitter-base junction produces a light output as well as an amplified electrical signal on the collector terminal. One of the problems associated with the design, however, is that, in order to produce an amplified output electrical modulation signal at the collector terminal, the base region must be designed to be thin so that the majority of electrons from the emitter are able to pass across the base region and arrive at the collector, resulting in fewer electrons available for recombining with holes in the base region to produce light. Consequently, the optical output at the logical HIGH state of the laser is lower than the optical output at the logical HIGH state in typical two-terminal VCSELs.

Accordingly, a need exists for a three-terminal VCSEL that is capable of achieving higher speeds than known two-terminal and three-terminal VCSELs without sacrificing optical output.

SUMMARY OF THE INVENTION

The invention is directed to a three-terminal VCSEL and a method for operating a three-terminal VCSEL. In accordance with one embodiment, the VCSEL comprises an n-type substrate, an emitter contact disposed on a bottom surface of the substrate, a first plurality of n-type layers disposed on top of the top surface of the substrate and having pairs of layers of alternating high and low refractive index that operate as a first DBR, at least one n-type cavity confining layer disposed on top of the first plurality of n-type layers, a plurality of active layers containing one or more quantum wells disposed on top of the n-type cavity confining layer, at least one p-type cavity confining layer disposed on top of the plurality of active layers, a base contact disposed on or in a portion of the p-type cavity confining layer such that the base contact is in contact with at least one of the active layers, a second plurality of n-type layers disposed on top of a portion of the p-type cavity confining layer and comprising pairs of layers of alternating high and low refractive index that operate as a reflector, and a collector contact disposed on or in a portion of at least one of the second plurality of n-type layers such that the collector contact is in contact with at least one of the n-type layers of the second plurality. The emitter, base and collector contacts correspond to first, second and third terminals, respectively, of the VCSEL.

In accordance with another embodiment, the VCSEL comprises an n-type substrate, an emitter contact disposed on a bottom surface of the substrate, a first plurality of n-type layers disposed on top of the top surface of the substrate and having pairs of layers of alternating high and low refractive index that operate as a first DBR, at least one n-type cavity confining layer disposed on top of the first plurality of n-type layers, a plurality of active layers containing one or more quantum wells disposed on top of the n-type cavity confining layer, at least one p-type cavity confining layer disposed on top of the plurality of active layers, a base contact disposed on or in a portion of the p-type cavity confining layer such that the base contact is in contact with at least one of the active layers, an n-type collector contact layer disposed on top of the second plurality of n-type layers, a collector contact disposed on or in a portion of the n-type collector contact layer, and a third plurality of non-conducting intrinsic semiconductor layers or dielectric material layers disposed on top of the collector contact layer and comprising pairs of layers of alternating high and low refractive index that operate as a DBR. The emitter, base and collector contacts correspond to first, second and third terminals, respectively, of the VCSEL.

In accordance with another embodiment, the VCSEL comprises a p-type substrate, an emitter contact disposed on a bottom surface of the substrate, a first plurality of p-type layers disposed on top of the top surface of the substrate and having pairs of layers of alternating high and low refractive index that operate as a first DBR, at least one p-type cavity confining layer disposed on top of the first plurality of p-type layers, a plurality of active layers containing one or more quantum wells disposed on top of the p-type cavity confining layer, at least one n-type cavity confining layer disposed on top of the plurality of active layers, a base contact disposed on or in a portion of the n-type cavity confining layer such that the base contact is in contact with at least one of the active layers, a second plurality of p-type layers disposed on top of a portion of the n-type cavity confining layer and comprising pairs of layers of alternating high and low refractive index that operate as a reflector, and a collector contact disposed on or in a portion of at least one of the second plurality of p-type layers such that the collector contact is in contact with at least one of the p-type layers of the second plurality. The emitter, base and collector contacts correspond to first, second and third terminals, respectively, of the VCSEL.

In accordance with another embodiment, the VCSEL comprises an p-type substrate, an emitter contact disposed on a bottom surface of the substrate, a first plurality of p-type layers disposed on top of the top surface of the substrate and having pairs of layers of alternating high and low refractive index that operate as a first DBR, at least one p-type cavity confining layer disposed on top of the first plurality of n-type layers, a plurality of active layers containing one or more quantum wells disposed on top of the p-type cavity confining layer, at least one n-type cavity confining layer disposed on top of the plurality of active layers, a base contact disposed on or in a portion of the n-type cavity confining layer such that the base contact is in contact with at least one of the active layers, a p-type collector contact layer disposed on top of the second plurality of p-type layers, a collector contact disposed on or in a portion of the p-type collector contact layer, and a third plurality of non-conducting intrinsic semiconductor layers or dielectric material layers disposed on top of the collector contact layer and comprising pairs of layers of alternating high and low refractive index that operate as a DBR. The emitter, base and collector contacts correspond to first, second and third terminals, respectively, of the VCSEL.

The method comprises the following: providing a three-terminal VCSEL having an emitter, a base, a collector, an emitter contact disposed on the emitter, a base contact disposed on the base and a collector contact disposed on the collector, applying an electrical potential across the base and emitter contacts to place the base-emitter junction in a forward-biased condition to cause an intensity level of an optical signal being output from the base to increase to a level that is above the lasing threshold level for lasing light emission; applying an electrical potential across the base and collector contacts to place the base-collector junction in a forward-biased condition to thereby cause the level of the optical signal being output from the base to transition to the logical HIGH level of the VCSEL; at some instant in time after the level of the optical signal has reached the logical HIGH level, applying an electrical potential to the base and collector contacts to place the base-collector junction in a reverse-biased condition and maintaining the base-collector junction in the reverse-biased condition on the falling edge of the optical signal.

Placing the base-collector junction in the reverse-biased condition causes the optical signal to transition from the logical HIGH level to the logical LOW level. Maintaining the base-collector junction in the reverse-biased condition on the falling edge of the optical signal provides field-assisted removal of carriers from the active region and thereby increases the rate at which the intensity level of the optical signal transitions from the logical HIGH level to a logical LOW level.

These and other features and advantages of the invention will become apparent from the following description, drawings and claims.

DETAILED DESCRIPTION OF AN EXEMPLARY EMBODIMENT

Figure 1A:
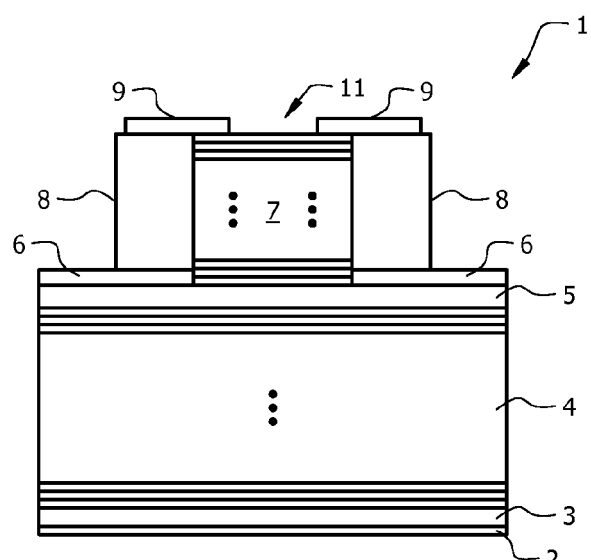
FIGS. 1A and 1B illustrate side cross-sectional and top plan views, respectively, of the three-terminal VCSEL in accordance with one illustrative embodiment.

The invention is directed to a three-terminal VCSEL that has a reduced fall time that allows the VCSEL to be operated at higher speeds. The invention is also directed to a method of operating the VCSEL in a manner that reduces the fall time of the VCSEL thereby increasing the operating speed of the VCSEL. Furthermore, the VCSEL and the method provide for higher operating speeds of the VCSEL without decreasing the optical output of the VCSEL. Illustrative, or exemplary, embodiments will now be described with reference to FIGS. 1A-4B, in which like reference numerals represent like features, elements or components. FIGS. 1A-4B are not drawn to scale and are intended only to demonstrate the principles and concepts of the invention. Persons skilled in the art will understand the manner in which a three-terminal VCSEL that embodies those principles and concepts may be constructed based on the following description of FIGS. 1A-4B.

Some of the three-terminal VCSEL configurations described below are structurally different from the known three-terminal VCSEL configurations described above, while other embodiments described below may be similar or identical to the known three-terminal VCSEL configurations described above, but are used with novel modulation schemes that cause the three-terminal VCSEL to operate in a manner that is different from the manner in which the known three-terminal VCSELs operate. Prior to describing the novel modulation schemes, various configurations of the three-terminal VCSEL of the invention will be described with reference to illustrative, or exemplary, embodiments.

Figure 1B:
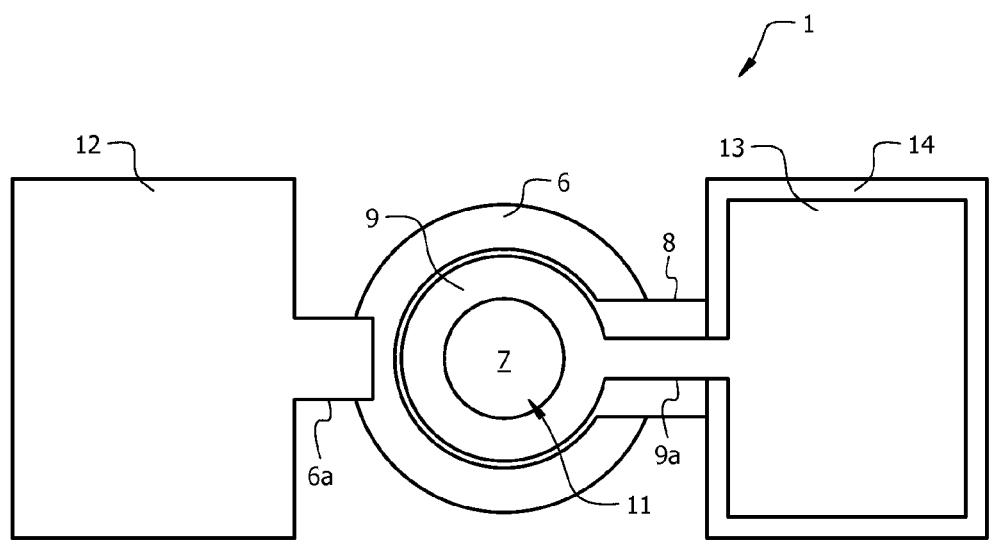

FIGS. 1A and 1B illustrate side cross-sectional and top plan views, respectively, of the three-terminal VCSEL 1 in accordance with one illustrative embodiment. The VCSEL 1 includes an emitter contact 2, an n-type substrate 3, an n-type DBR 4 disposed on a top surface of the substrate 3, lightly p-doped or undoped active layers 5 disposed on top of the DBR 4, an ohmic base contact 6 disposed on top of a portion of the active layers 5, an n-type DBR 7 disposed on top of the active layers 5 in an area of the active layers 5 that is not covered by the ohmic base contact 6, an isolation layer 8 disposed on the ohmic base contact 6 and surrounding side portions of the DBR 7, and an ohmic collector contact 9 disposed on top of portions of the top surface of the isolation layer 8 and on top of portions of the top surface of the DBR 7 such that an aperture 11 exists for light to pass out of the VCSEL 1. The isolation layer 8 comprises a low dielectric-constant material such as, for example, Benzocyclobutene (BCB) or polyimide.

The top plan view of FIG. 1B shows the ohmic base and collector contact pads 12 and 13, respectively, and the interconnects 6a and 9a connecting the base and collector contact pads 12 and 13, respectively, to the base and collector contacts 6 and 9, respectively. The collector contact pad 13 is disposed on top of a layer of dielectric material 14 that is not shown in FIG. 1A. The emitter contact pad is not visible in the top plan view of FIG. 1B.

Although not shown in FIGS. 1A and 1B for purposes of clarity, an undoped or n-doped cavity confining layer is disposed between the top layer of the DBR 4 and the bottom layer of the active layers 5, and a p+ doped cavity confining layer is disposed between the top layer of the active layers 5 and the bottom layer of the DBR 7. In addition, one or more pairs of alternating low and high refractive index layers (not shown for purposes of clarity) are typically disposed in between the p+ doped cavity confining layer and the DBR 7. An n-type oxidation layer (not shown for purposes of clarity) that is between about 0.75 wavelengths and 1.25 wavelengths in thickness may be disposed between the one or more pairs of alternating low and high refractive index layers and the DBR 7.

The invention is not limited with respect to the chemical elements or compounds that are used for the various layers of the VCSEL 1. Known semiconductor processes may be used to fabricate the VCSEL 1, although the invention is not limited with respect to the processes that are used to make the VCSEL 1. An example of materials that may be used to make the VCSEL 1 is as follows: the substrate 3 is made of n-doped gallium arsenide (GaAs); the DBR 4 is made up of several layers (typically 50 to 60) of n-doped aluminum gallium arsenide (AlGaAs) having different percentages of Al or Ga to make them alternate between high and low refractive indices; the active layers 5, which correspond to the active region of the VCSEL 1, contain GaAs quantum wells (typically three to five pairs) that are un-doped or have a very low p doping; the DBR 7 is made up of several layers (typically 16 to 30 pairs) of n-doped AlGaAs having different percentages of Al or Ga to make them alternate between high and low refractive indices; and the emitter, base and collector ohmic contacts 2, 6 and 9, respectively, and the contact pads 12 and 13 are typically made of a metallic material.

The layers of the DBR 7 are made up of alternating layers of high and low refractive index material. In accordance with an embodiment, the layers of high refractive index material include quantum wells that allow for electro-absorption (EA) modulation of the collector region. The quantum wells are non-absorbing (i.e., reflective) when the base-collector junction is forward biased (i.e., zero or positive voltage applied across contacts 6 and 9 in a n-p-n embodiment of the structure), but are absorbing when the base-collector junction is reverse biased (i.e., negative voltage applied across contacts 6 and 9 in a n-p-n embodiment of the structure). Consequently, when the base-collector junction is reverse biased, reduced photon recycling will occur in the base region due to the occurrence of optical absorption induced by the Quantum Confined Stark Effect (QCSE) in the DBR 7. The reduction in photon recycling results in a further reduction, in addition to that produced by the field-assisted removal of carriers described above, in the fall time of the optical output. In other words, the VCSEL 1 turns off faster when placed in the logical LOW state, which means that the VCSEL 1 is capable of operating at higher speeds.

Figure 2A:
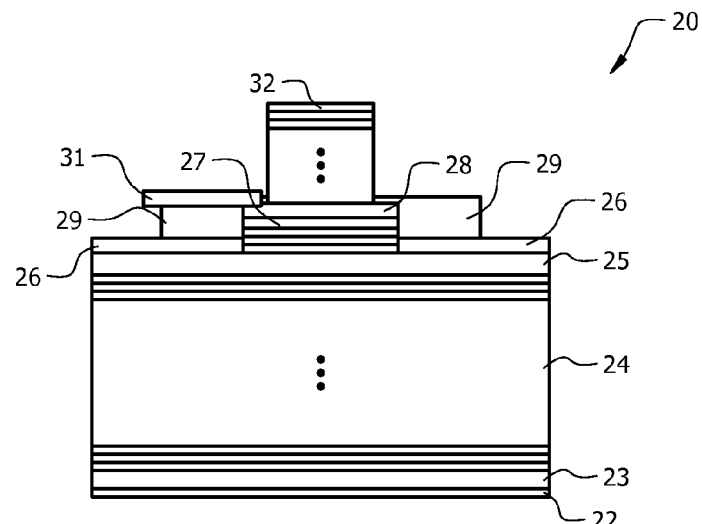
FIGS. 2A and 2B illustrate side cross-sectional and top plan views, respectively, of the three-terminal VCSEL in accordance with another illustrative embodiment.
Figure 2B:
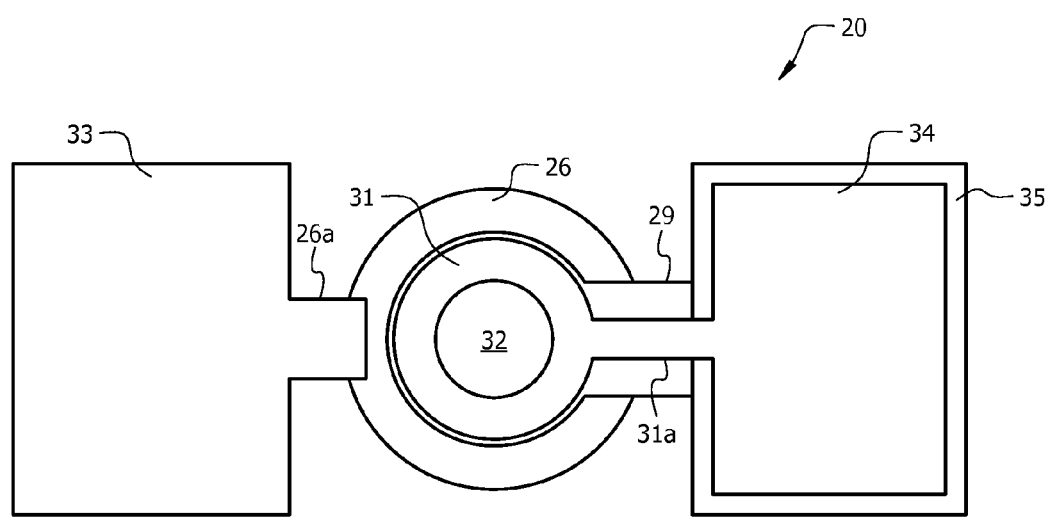

FIGS. 2A and 2B illustrate side cross-sectional and top plan views, respectively, of the three-terminal VCSEL 20 in accordance with another illustrative embodiment. The VCSEL 20 includes an emitter ohmic contact 22, an n-type substrate 23, an n-type DBR 24 disposed on a top surface of the substrate 23, lightly p-doped or undoped active layers 25 disposed on top of the DBR 24, an ohmic base contact 26 disposed on top of a portion of the active layers 25, an n-type DBR 27 disposed on top of the active layers 25 in an area of the top of the active layers 25 that is not covered by the ohmic base contact 26, an n-type transparent semiconductor collector contact layer 28 disposed on top of the DBR 27, a low dielectric-constant (e.g., BCB or polyimide) isolation layer 29 disposed on the ohmic base contact 26 and surrounding side portions of the DBR 27 and collector contact layer 28, an ohmic collector contact 31 disposed on top of portions of the isolation layer 29 and the collector contact layer 28, and an undoped semiconductor DBR 32 disposed on top of portions of the collector contact layer 28.

The top plan view of FIG. 2B shows the ohmic base and collector contact pads 33 and 34, respectively, and the interconnects 26a and 31a connecting the base and collector contact pads 33 and 34, respectively, to the base and collector contacts 26 and 31, respectively. The collector contact pad 34 is disposed on top of a layer of dielectric material 35 that is not shown in FIG. 2A, but which can be an extension of the dielectric material 29 or a dielectric material deposited separately. The emitter contact pad is not visible in the top plan view of FIG. 2B.

Although not shown in FIGS. 2A and 2B for purposes of clarity, an undoped or n-doped cavity confining layer is disposed between the top layer of the DBR 24 and the bottom layer of the active layers 25, and a p+ doped cavity confining layer is disposed between the top layer of the active layers 25 and the bottom layer of the DBR 27. One or more pairs of alternating low and high refractive index layers (not shown for purposes of clarity) are typically disposed in between the p+ doped cavity confining layer and the DBR 27. An n-type oxidation layer (not shown for purposes of clarity) that is between about 0.75 wavelengths and 1.25 wavelengths in thickness may be disposed between the one or more pairs of alternating low and high refractive index layers and the DBR 27.

The same materials and processes that are used to make the VCSEL 1 shown in FIGS. 1A and 1B may be used to make the VCSEL 20 shown in FIGS. 2A and 2B. The primary difference between the VCSELs 1 ands 20 is that the locations of the collector contacts are different. Moving the collector contact to the location shown in FIGS. 2A and 2B allows the top DBR 32 to be undoped semiconductor material, which reduces optical losses.

Figure 3A:
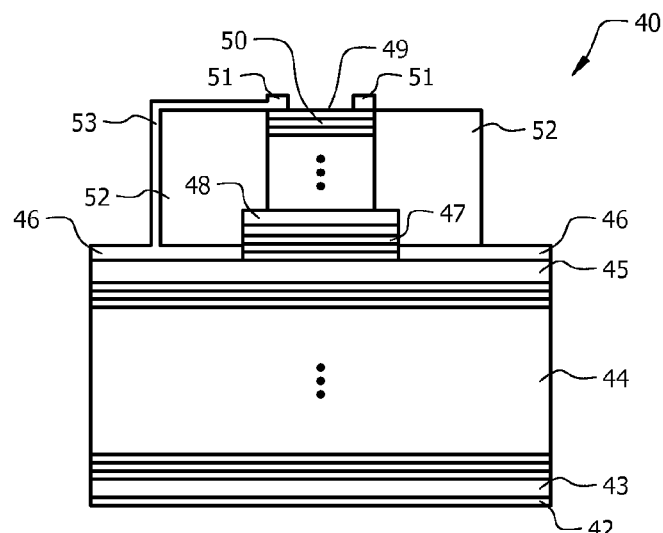
FIGS. 3A and 3B illustrate side cross-sectional and top plan views, respectively, of the three-terminal VCSEL in accordance with another illustrative embodiment.
Figure 3B:
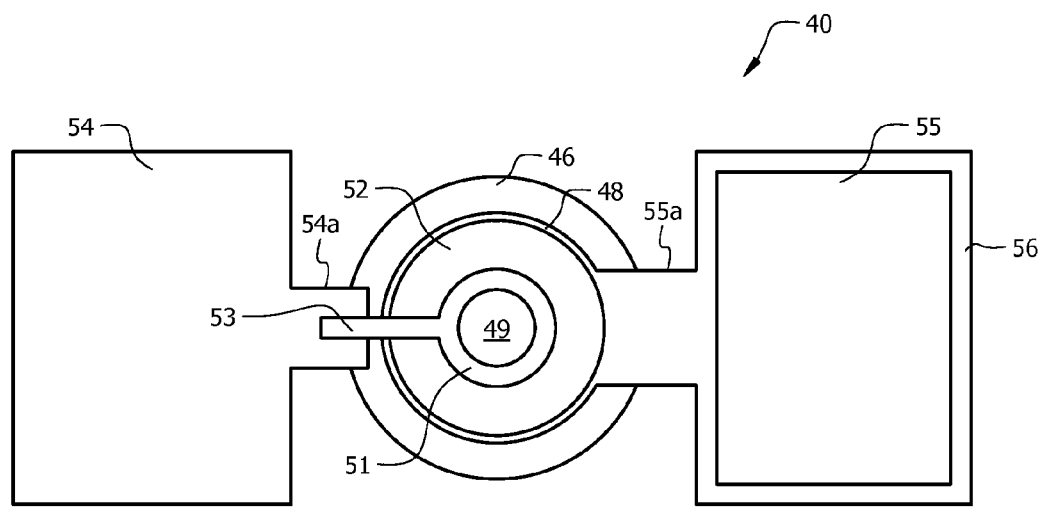

FIGS. 3A and 3B illustrate side cross-sectional and top plan views, respectively, of the three-terminal VCSEL 40 in accordance with one illustrative embodiment. The same materials and processes that are used to make the VCSELs 1 and 20 shown in FIGS. 1A-2B may be used to make the VCSEL 40 shown in FIGS. 3A and 3B. The VCSEL 40 includes an ohmic emitter contact 42, an n-type substrate 43, an n-type DBR 44 disposed on a top surface of the substrate 43, lightly p-doped or undoped active layers 45 disposed on top of the DBR 44, an ohmic base contact 46 disposed on top of a portion of the active layers 45, an n-type DBR 47 disposed on top of the active layers 45 in an area that is not covered by the ohmic base contact 46, an n+ transparent semiconductor collector contact 48 disposed on top of the DBR 47, an intrinsic semiconductor DBR 50 disposed on top of the n+ transparent collector contact 48, a p-type layer 49 disposed on top of DBR 50, a ring-shaped p contact 51 disposed on top of the p-type layer 49, a low dielectric-constant material (e.g., BCB or polyimide) isolation layer 52 disposed on the ohmic base contact 46 and surrounding side portions of DBR 47, contact 48 and DBR 50, and an interconnect 53 connecting the ohmic base contact 46 with the ring-shaped p contact 51.

The top plan view of FIG. 3B shows the base and collector ohmic contact pads 54 and 55, respectively, and the interconnects 54a and 55a that connect the contact pads 54 and 55, respectively, to the contacts 46 and 48, respectively. The top plan view of FIG. 3B also shows the interconnect 53 that interconnects the contact 46 with the contact 51. The collector contact pad 55 is disposed on top of a layer of dielectric material 56 that is not shown in FIG. 3A. The emitter contact pad is not visible in the top plan view of FIG. 3B.

The intrinsic DBR 50 is made up of alternating layers of high and low refractive index material. The layers of high refractive index material include quantum wells that allow for EA modulation of the collector region. The quantum wells are non-absorbing (i.e., reflective) when the base-collector junction is forward biased (i.e., zero or positive voltage applied across contact 51, which is connected to contacts 46 and 48), but are absorbing when the base-collector junction is reverse biased (i.e., negative voltage applied across contacts 48 and 51, which is connected to base contact 46). Consequently, when the base-collector junction is reverse biased, reduced photon recycling will occur in the base region due to the occurrence of QCSE in the DBR 50. The reduction in photon recycling results in a reduction in the fall time of the optical output, which allows the VCSEL 40 to operate at higher speeds.

Figure 4A:
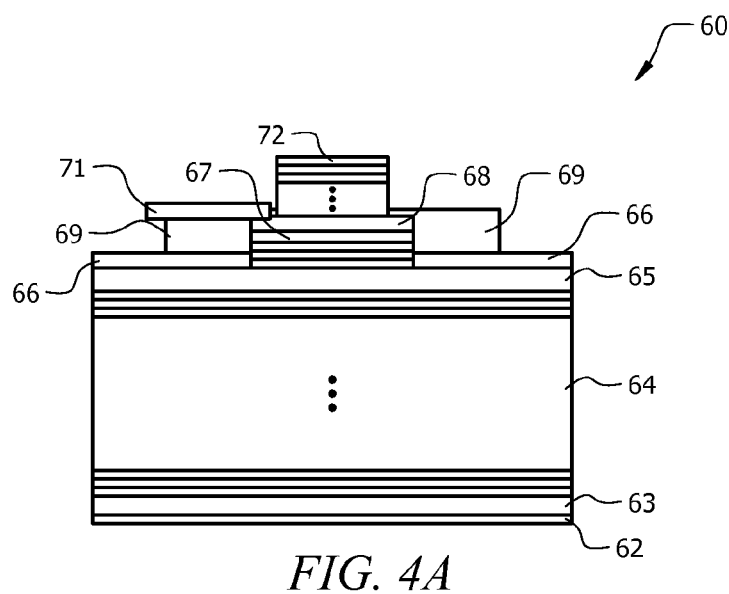
FIGS. 4A and 4B illustrate side cross-sectional and top plan views, respectively, of the three-terminal VCSEL in accordance with another illustrative embodiment.
Figure 4B:
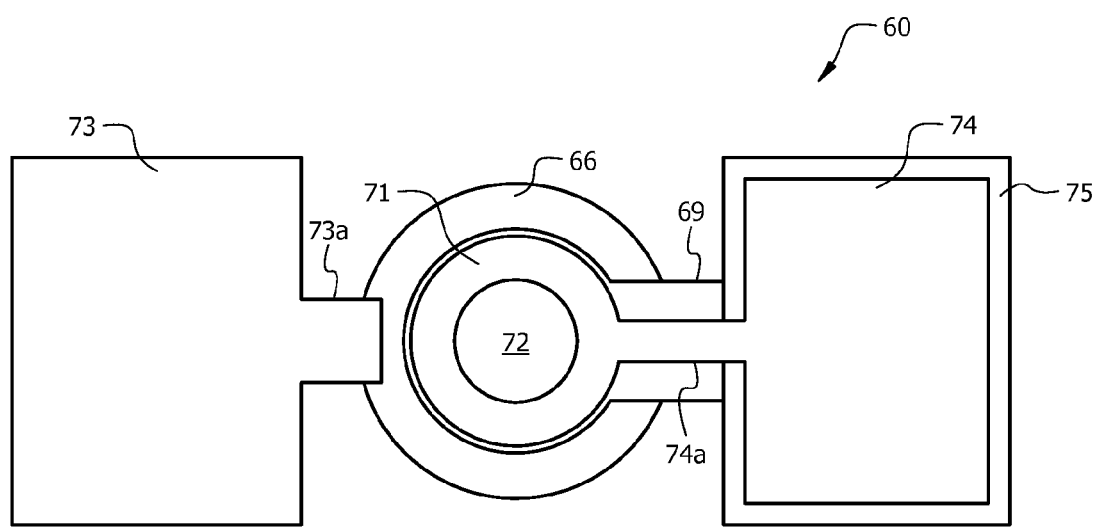

FIGS. 4A and 4B illustrate side cross-sectional and top plan views, respectively, of the three-terminal VCSEL 60 in accordance with another illustrative embodiment. The VCSEL 60 includes an emitter ohmic contact 62, an n-type substrate 63, an n-type DBR 64 disposed on a top surface of the substrate 63, lightly p-doped or undoped active layers 65 disposed on top of the DBR 64, an ohmic base contact 66 disposed on top of a portion of the active layers 65, a plurality of n-doped or undoped layers 67 of alternating high and low refractive index disposed on top of the active layers 65 in an area that is not covered by the ohmic base contact 66, an n-type transparent semiconductor or transparent conducting oxide (TCO) collector contact layer 68 disposed on top of the layers 67 of alternating high and low refractive index, a BCB isolation layer 69 disposed on the ohmic base contact 66 and surrounding side portions of layers 67 and 68, an ohmic collector contact 71 disposed on top of portions of the BCB isolation layer 69 and the collector contact layer 68, and a plurality of layers 72 of alternating low and high refractive index insulating dielectric layers that make up a dielectric mirror disposed on top of portions of the collector contact layer 68.

The top plan view of FIG. 4B shows the ohmic base and collector contact pads 73 and 74, respectively, and the interconnects 66a and 71a connecting the base and collector contact pads 73 and 74, respectively, to the base and collector contacts 66 and 71, respectively. The collector contact pad 74 is disposed on top of a layer of dielectric material 75 that is not shown in FIG. 4A. The emitter contact pad is not visible in the top plan view of FIG. 4B.

Although not shown in FIGS. 4A and 4B for purposes of clarity, an undoped or n-doped cavity confining layer is disposed between the top layer of the DBR 64 and the bottom layer of the active layers 65, and a p+-doped cavity confining layer is disposed between the top layer of the active layers 65 and the bottom layer of layers 67. Layers 67 comprise one or more pairs of layers of alternating high and low refractive index. In accordance with one illustrative embodiment, the layers 67 are n-type layers. In accordance with another illustrative embodiment, the layers 67 are undoped and quantum wells are formed in the layers 67 that have high refractive indices. The inclusion of the quantum wells in these layers provides relatively mild EA modulation when the base-collector junction is reverse biased, which reduces the VCSELs fall time when it is in the logical LOW state. In addition, the use of the dielectric minor 72 over the collector region instead of a DBR has the effect of shortening photon lifetime, which also reduces the VCSEL's fall time.

The same materials and processes that are used to make the VCSELs 1, 20 and 40 shown in FIGS. 1A-3B may be used to make the VCSEL 60 shown in FIGS. 4A and 4B. The dielectric mirror 72 can also be formed using well-known processes and materials.

Figure 5:
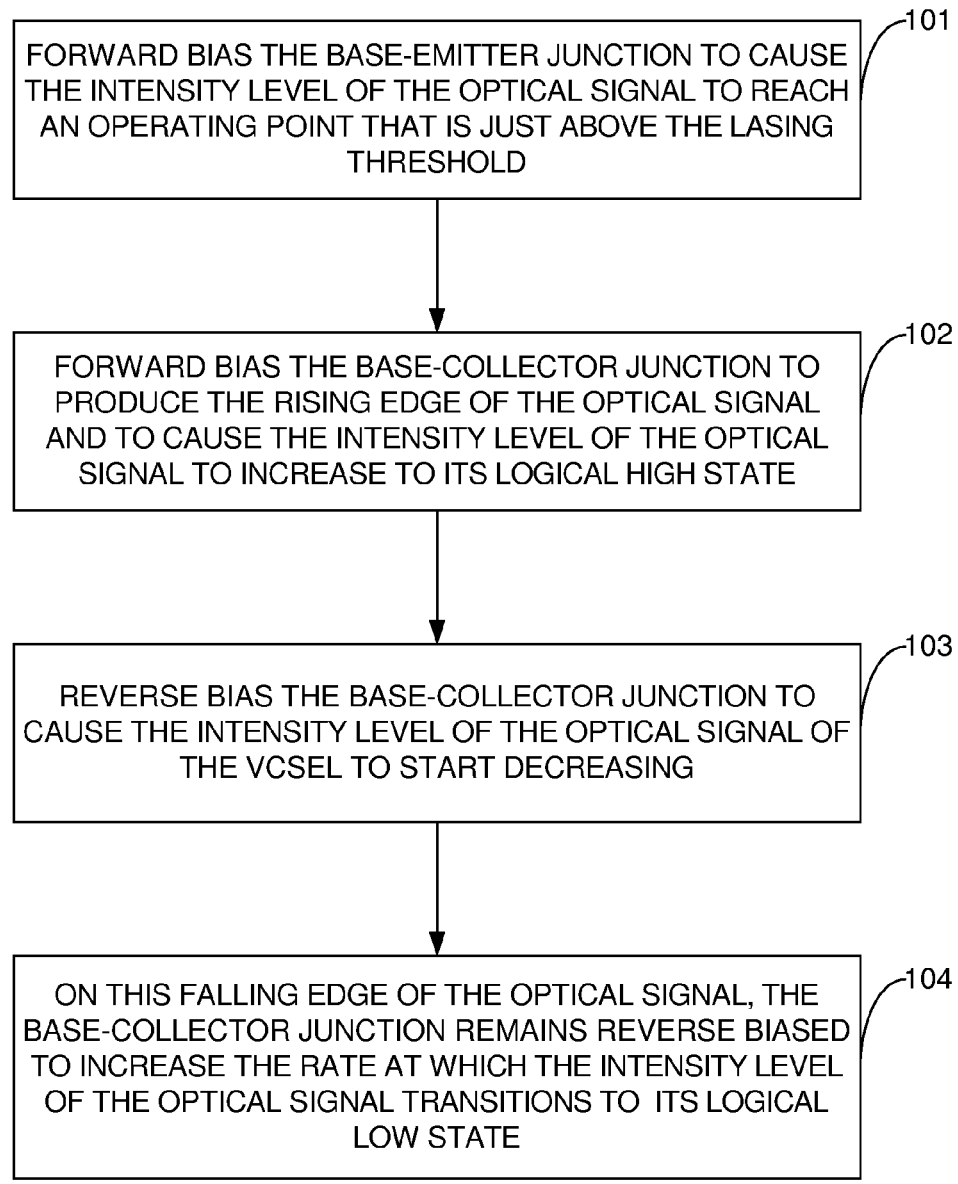
FIG. 5 illustrates a flowchart that represents the method of operating the three-terminal VCSEL in accordance with an illustrative embodiment.

Various modulation schemes may be used with VCSELs 1, 20, 40, and 60 described above to reduce the fall times of the VCSELs when they are switched to the logical LOW states. One of the modulation schemes will now be described with reference to FIG. 5. FIG. 5 illustrates a flowchart that represents the method of operating the three-terminal VCSEL in accordance with an illustrative embodiment. The base-emitter junction is forward biased in order to cause the intensity level of the optical signal outputted from the base to reach a level that is above the lasing threshold, thereby establishing the operating point that lies between the logical HIGH and the logical LOW states, as indicated by block 101. To switch VCSEL to the logical HIGH state and produce the rising edge of the optical signal, the base-collector junction is also forward biased, as indicated by block 102. When these junctions are forward biased, electrons from both the emitter region and the collector region are injected into the base region where they recombine with holes to produce a maximum light output (i.e., a logical HIGH).

In order to switch the VCSEL to the logical LOW state, the base-collector junction is reverse biased, as indicated by block 103, which causes the intensity level of the optical signal to start transitioning toward the logical LOW state. On this falling edge of the optical output of the VCSEL, the base-collector junction remains reverse biased, as indicated by block 104. While the base-collector junction is reverse biased, none of the electrons from the collector region are injected into the base region and a large portion of the electrons from the emitter region pass through the base region without recombining with holes and enter the collector region. This reduced recombination decreases the output light level. The doping levels in the emitter and base regions are designed to allow the reverse-bias field to penetrate into the base region (i.e., the active layer of the VCSEL) to help speed up the removal of electrons and thereby speed up the falling edge of the optical output. As a result, the VCSEL is modulated from the logical HIGH state to the logical LOW state in a shorter period of time.

In addition to imposing the input modulation on the collector terminal, as described above, another example of a modulation scheme that may be used with the invention is referred to herein as a push-pull modulation scheme. The push-pull modulation scheme may be used with, for example, the VCSEL 40 shown in FIGS. 3A and 3B. In accordance with the push-pull modulation scheme, the electrical signals that are applied to the emitter contact 42 and to the collector contact 48 are maintained 180° out of phase from one another. Using this scheme decouples the photon density inside of the cavity from the carrier density inside of the active region. The quantum wells included in the high index of refraction layers of the DBR 50 provide EA modulation of the output coupling that allows higher modulation speeds to be achieved.

The use of this modulation scheme will be further described with reference to FIGS. 1A and 1B. For this example, it will be assumed that the uppermost layers of the DBR 7 are intrinsic (undoped) layers made up of alternating layers of high and low refractive index material and that the layers of high refractive index material include quantum wells that allow for EA modulation of the collector region. As the electrical signal applied to collector contact 9 causes the collector-base junction to be forward biased, more electrons are injected into the base region (i.e., the active region of the VCSEL 1), which increases the carrier density in the active region while producing no optical attenuation in DBR 7. A 180° out-of-phase signal applied to the emitter contact 2 at the same time causes the emitter-base junction to be reverse biased and reduces the carrier density in the active region. At appropriately prescribed signal levels on collector contact 9 and emitter contact 2, and with the absence of optical attenuation in DBR 7, the forward-biased collector-base junction and reverse-biased emitter-base junction can set VCSEL 1 to produce the desired logical HIGH output light level.

When the modulation signal on the collector contact 9 swings to the opposite direction to cause the collector-base junction to be reverse-biased, and the 180° out-of-phase signal on the emitter contact 2 causes the emitter-base junction to be forward biased, there will be fewer electrons injected from the collector into the base and more electrons injected from the emitter into the base. The carrier concentration, and therefore the light output level, tends to also remain unchanged during this cycle. However, in this cycle, with the collector-base junction reverse biased, as indicated above, the quantum wells in the high refractive index layers of the DBR 7 are now absorbing (as opposed to reflecting). Consequently, the intensity level of the light that actually exits VCSEL 1 in this phase of the modulation is lower than that from the phase during which the collector-base junction is forward biased. This phase of having the collector-base junction reversed biased and the emitter-base junction forward biased, therefore, produces the logical LOW level desired.

It should be noted that because the electro-optical absorption introduced during this phase of the modulation not only attenuates light traveling outward, but also attenuates light reflected back to the active region, the net light output modulation is larger than that produced by an identical electro-absorption modulator placed outside the VCSEL cavity. Because the output light modulation from logical HIGH to logical LOW is generated with the photon and carrier density inside the cavity being nearly the same, the bandwidth limitation imposed by the relaxation oscillation, an oscillation set up by photon density failing to change fast enough in response to carrier density change, or vice versa, in a typical VCSEL is nearly eliminated. Consequently, using the push-pull modulation scheme with the VCSELs of the invention will allow operation at much higher speeds than that which are achievable with typical VCSELs.

While the VCSELs 1, 20, 40, and 60 have been described as being made primarily of GaAs related materials, other compounds may be used for the VCSELs. The compounds that are used for the VCSELs 1, 20, 40, and 60 are selected to have desired bandgap energies that enable desired light emission wavelengths to be produced. Examples of other suitable materials that may be used for the VCSELs 1, 20, 40, and 60 include, but are not limited to, aluminum gallium arsenide (AlGaAs), gallium phosphide (GaP), indium gallium phosphide (InGaP), gallium nitride (GaN), indium gallium arsenide (InGaAs), indium gallium arsenide nitride (InGaNAs), indium phosphide (InP), and gallium indium phosphide (GaInP). It should also be noted that layers that are designated in FIGS. 1A, 2A, 3A, and 4A as being of n-type may instead be of p-type, and vice versa. Also, instead of using a p-type or n-type substrate, the substrate may be a semi-insulating substrate. In cases in which a semi-insulating substrate is used, the emitter contact is not disposed on the bottom surface of the substrate, but rather is disposed in an area above the substrate and below the active region at a location where portions of the epitaxially-grown layers have been removed. Persons skilled in the art will understand, in view of the description provided herein, how such a VCSEL that incorporates a semi-insulating substrate may be made.

It should be noted that the invention has been described with reference to illustrative embodiments and that the invention is not limited to these embodiments. Those skilled in the art will understand the manner in which modifications can be made to the illustrative embodiments and that all such modifications are within the scope of the invention. For example, while FIGS. 1A, 2A, 3A, and 4A show particular combinations of layers, the VCSELs 1, 20, 40, and 60 may include more layers or fewer layers than what is shown in FIGS. 1A, 2A, 3A, and 4A. Also, the locations of the layers may be different from that which is shown in the figures. For example, the DBRs may be disposed at locations that are different from those which are shown in the figures. These and other modifications may be made to the embodiments described herein and all such modified embodiments are also within the scope of the invention, as will be understood by persons skilled in the art.

What is claimed is:

1. A three-terminal vertical cavity surface emitting laser (VCSEL) comprising:
   a substrate having at least a top surface and a bottom surface;
   an emitter contact corresponding to a first terminal;
   a first plurality of n-type layers disposed on top of the top surface of the substrate, wherein the first plurality of n-type layers comprise pairs of layers of alternating high and low refractive index that operate as a first distributed Bragg reflector (DBR);
   at least one n-type cavity confining layer disposed on top of the first plurality of n-type layers;
   a plurality of active layers containing one or more quantum wells disposed on top of the n-type cavity confining layer, the active layers comprising a light-emitting material and being either lightly p-doped or intrinsic;

at least one p-type cavity confining layer disposed on top of the plurality of active layers;

a base contact disposed on or in a portion of the p-type cavity confining layer such that the base contact is in contact with at least one of the active layers, the base contact corresponding to a second terminal of the VCSEL;

a second plurality of n-type layers disposed on top of a portion of the p-type cavity confining layer, wherein the second plurality of n-type layers comprise pairs of layers of alternating high and low refractive index that operate as a reflector; and a collector contact disposed on or in a portion of at least one of the second plurality of n-type layers such that the collector contact is in contact with at least one of the n-type layers of the second plurality, and wherein the collector contact corresponds to a third terminal of the VCSEL.

2. The VCSEL of claim 1, wherein the substrate is an n-type substrate.

3. The VCSEL of claim 1, wherein the substrate is a semi-insulating substrate.

4. The VCSEL of claim 1, wherein the pairs of layers of the second plurality of n-type layers comprise a second DBR.

5. The VCSEL of claim 4, wherein at least some of the layers of the second DBR that have high indexes of refraction include quantum wells.

6. The VCSEL of claim 5, further comprising an n-type collector contact layer disposed between said at least one p-type cavity confining layer and the second DBR, and wherein the collector contact is disposed on or in the n-type collector contact layer.

7. The VCSEL of claim 1, wherein the pairs of layers of the second plurality of n-type layers comprise a dielectric mirror.

8. The VCSEL of claim 7, further comprising:

an n-type collector contact layer disposed between said at least one p-type cavity confining layer and the dielectric mirror, and wherein the collector contact is disposed on or in the n-type collector contact layer.

9. The VCSEL of claim 1, further comprising an interconnect that connects the base contact to the collector contact.

10. A three-terminal vertical cavity surface emitting laser (VCSEL) comprising:

a substrate having at least a top surface and a bottom surface;

an emitter contact corresponding to a first terminal;

a first plurality of p-type layers disposed on top of the top surface of the substrate, wherein the first plurality of p-type layers comprise pairs of layers of alternating high and low refractive index that operate as a first distributed Bragg reflector (DBR);

at least one p-type cavity confining layer disposed on top of the first plurality of p-type layers;

a plurality of active layers containing one or more quantum wells disposed on top of the p-type cavity confining layer, the active layers comprising a light-emitting material and being either lightly n-doped or intrinsic;

at least one n-type cavity confining layer disposed on top of the plurality of active layers;

a base contact disposed on or in a portion of the n-type cavity confining layer such that the base contact is in contact with at least one of the active layers, the base contact corresponding to a second terminal of the VCSEL;

a second plurality of p-type layers disposed on top of a portion of the n-type cavity confining layer, wherein the second plurality of p-type layers comprise pairs of layers of alternating high and low refractive index that operate as a reflector; and a collector contact disposed on or in a portion of at least one of the second plurality of p-type layers such that the collector contact is in contact with at least one of the p-type layers, the collector contact corresponding to a third terminal of the VCSEL.

11. The VCSEL of claim 10, wherein the substrate is a p-type substrate.

12. The VCSEL of claim 10, wherein the substrate is a semi-insulating substrate.

13. The VCSEL of claim 10, wherein the pairs of layers of the second plurality of p-type layers comprise a second DBR.

14. The VCSEL of claim 13, wherein at least some of the layers of the second DBR that have high indexes of refraction include quantum wells.

15. The VCSEL of claim 13, further comprising a p-type collector contact layer disposed between said at least one n-type cavity confining layer and the second DBR, and wherein the collector contact is disposed on or in the p-type collector contact layer.

16. The VCSEL of claim 10, wherein the pairs of layers of the second plurality of p-type layers comprise a dielectric mirror.

17. The VCSEL of claim 16, further comprising:

a p-type collector contact layer disposed between said at least one n-type cavity confining layer and the dielectric mirror, and wherein the collector contact is disposed on or in the p-type collector contact layer.

18. The VCSEL of claim 10, further comprising an interconnect that connects the base contact to the collector contact.

* * * * *